(12) United States Patent
Farber et al.

(10) Patent No.: US 8,507,386 B2
(45) Date of Patent: Aug. 13, 2013

(54) LATERAL UNIFORMITY IN SILICON RECESS ETCH

(75) Inventors: David Gerald Farber, Plano, TX (US); Tom Lii, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 264 days.

(21) Appl. No.: 12/880,959

(22) Filed: Sep. 13, 2010

(65) Prior Publication Data

US 2012/0064686 A1 Mar. 15, 2012

(51) Int. Cl.
*H01L 21/302* (2006.01)
(52) U.S. Cl.
USPC .................. 438/719; 438/727; 438/739
(58) Field of Classification Search
USPC .............. 438/299–300, 706–714, 719, 727, 438/733, 735, 739, 749
See application file for complete search history.

(56) References Cited

U.S. PATENT DOCUMENTS

| 7,023,018 B2 | 4/2006 | Buss |
| 2002/0016080 A1* | 2/2002 | Khan et al. ............. 438/714 |
| 2008/0237634 A1 | 10/2008 | Dyer et al. |
| 2008/0242037 A1 | 10/2008 | Sell et al. |
| 2009/0032880 A1 | 2/2009 | Kawaguchi et al. |
| 2011/0201164 A1* | 8/2011 | Chung et al. ............. 438/229 |

OTHER PUBLICATIONS

Yeom et al., "Polysilicon Etchback Plasma Process Using HBr, Cl2, and SF6 Gas Mixtures for Deep-Trench Isolation", J. Electrochemical Soc., vol. 139, No. 2 (1992), pp. 575-579.

* cited by examiner

*Primary Examiner* — Thanhha Pham
(74) *Attorney, Agent, or Firm* — Jacqueline J. Garner; Wade J. Brady, III; Frederick J. Telecky, Jr.

(57) ABSTRACT

A method of etching recesses into silicon prior to formation of embedded silicon alloy source/drain regions. The recess etch includes a plasma etch component, using an etch chemistry of a primary fluorine-based or chlorine-based etchant, in combination with a similar concentration of hydrogen bromide. The concentration of both the primary etchant and the hydrogen bromide is relatively low; a diluent of an inert gas or oxygen is added to the reactive species. Loading effects on the undercut of the recess etch are greatly reduced, resulting in reduced transistor performance variation.

17 Claims, 10 Drawing Sheets

LATERAL UNIFORMITY IN SILICON RECESS ETCH

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of semiconductor integrated circuits. Embodiments of this invention are directed to uniformity of recess etch processes in connection with forming embedded silicon alloy structures.

Recent advances in semiconductor technology as applied to integrated circuits include the use of "strain engineering" (or, alternatively, "stress engineering") in the manufacture of semiconductor device structures. It has been discovered that the tuning of strain in the crystal lattice of metal-oxide-semiconductor (MOS) transistor channel regions can enhance carrier mobility in those regions. As is fundamental in MOS device technology, the source/drain current (i.e., drive) of an MOS transistor in both the triode and saturation regions is proportional to carrier mobility in the channel region. In a general sense, compressive stress enhances hole mobility in the channel region of a p-channel MOS transistor, and tensile stress enhances electron mobility in the channel region of an n-channel MOS transistor. Typically, p-channel MOS transistors exhibit lower drive capability than n-channel MOS transistors in typical modern integrated circuits. As such, strain engineering techniques are more typically applied to p-channel MOS transistors than to n-channel MOS transistors, in current day manufacturing technology.

Various strain engineering approaches are known in the art. According to the approach known as "embedded SiGe" (also referred to as "eSiGe"), the source and drain regions of a p-channel MOS transistor structure are etched from the silicon substrate or well region, and are replaced with a silicon-germanium alloy formed by selective epitaxy. Because of the germanium atoms within the crystal lattice, the germanium constituting as much as 25% to 30% (atomic) of the alloy, eSiGe exhibits a larger lattice constant than does silicon (i.e., the distance between unit cells in the crystal lattice for SiGe is greater than in single-crystal silicon). Embedded eSiGe source/drain regions thus apply compressive stress to the channel region of the p-channel MOS transistor being formed. This compressive stress in the channel increases the hole mobility of the p-channel MOS transistor, and enhances its performance.

A similar approach for improving carrier mobility is known for n-channel MOS transistors. Commonly assigned U.S. Pat. No. 7,023,018, incorporated herein by reference, describes the use of silicon-carbon alloy material as source/drain structures in n-channel MOS transistors. As described in that U.S. Patent, silicon-carbon source/drain structures cause an increase in tensile stress in a direction parallel to the intended direction of source/drain current flow in the transistor. This tensile stress in the source/drain regions increases tensile strain in the p-type channel region between the source and drain structures, which increases electron mobility in that channel region and thus improves the performance of the n-channel MOS transistor.

Figure 1A:
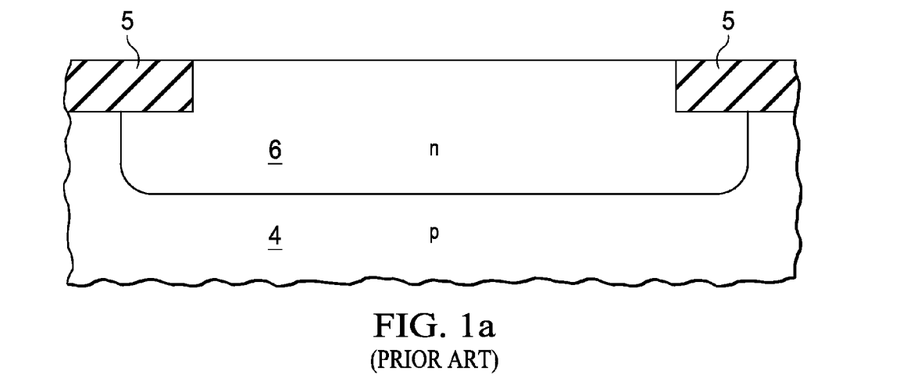
FIGS. 1a through 1d are cross-sectional views of a portion of an integrated circuit at various stages of construction according to conventional methods.
Figure 1B:
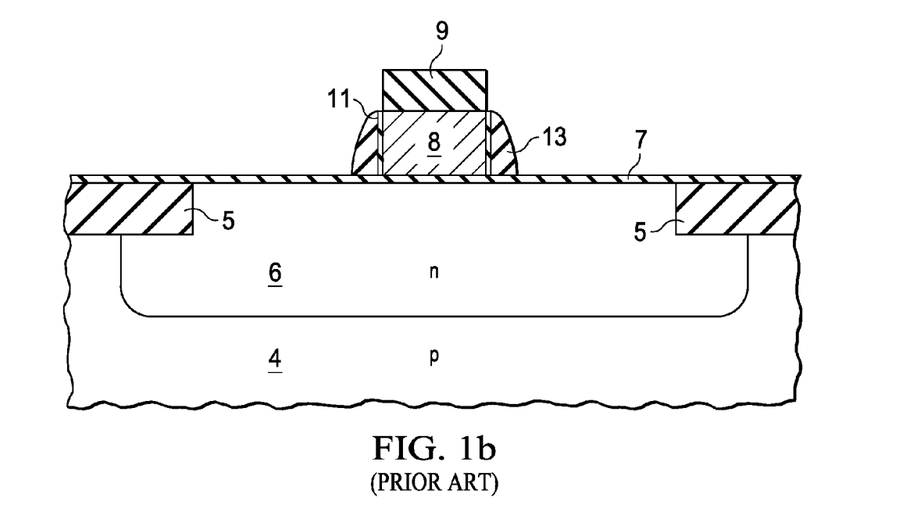

FIGS. 1a through 1d illustrate, in cross section, the fabrication of a conventional p-channel MOS transistor including eSiGe source/drain regions. FIG. 1a illustrates a portion of the integrated circuit structure including p-type substrate 4, with n-well 6 formed at selected locations of the surface of substrate 4, by way of ion implantation and diffusion in the conventional manner. Shallow trench isolation structures 5 are disposed at selected locations of the surface of substrate 4, formed by conventional etch and deposition processes. At the stage of the process shown in FIG. 1b, thermal oxidation or deposition of gate dielectric 7 has been followed by the deposition, photolithography, and etch of polysilicon gate structure 8. In this example, hard mask 9 is used to protect polysilicon gate structure 8 from the polysilicon etch, and remains in place. Typically, a "re-oxidation" of the patterned polysilicon is performed after its etch, resulting in thin oxide layer 11 on the side surfaces of polysilicon gate structure 8. Sidewall dielectric spacers 13 are formed on the sidewalls of gate structure 8 at this point by deposition and anisotropic etch, and will define more lightly-doped source/drain extensions as known in the art.

Figure 1C:
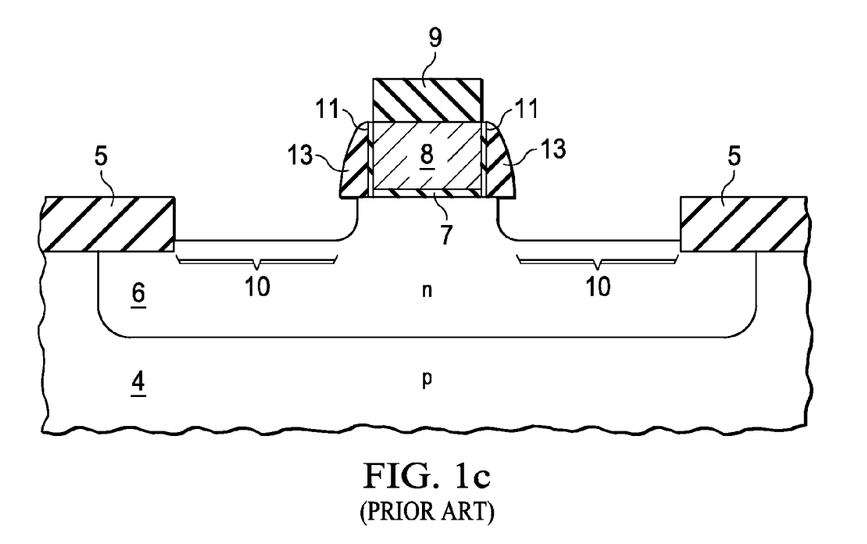

To form the embedded SiGe source/drain regions in this conventional process, remaining gate dielectric 7 is removed from the source/drain regions, and exposed locations of n-well 6 are etched, at locations outside of gate electrode 8 and sidewall spacers 13, to form recesses 10 into the underlying single-crystal silicon as shown in FIG. 1c. Hard mask 9 protects gate structure 8 from this recess etch. Recesses 10 are thus located at the source/drain regions of the transistor being formed at this location of substrate 4, and are essentially self-aligned with gate structure 8 but with some lateral etch occurring under sidewall spacers 13 as will be discussed in further detail below.

In conventional processes, the recess etch begins with an initial timed dry "breakthrough" etch that etches the implanted region at the surface (e.g., the result of a blanket implant setting the transistor threshold voltage). After this initial etch, a plasma etch under isotropic conditions is then performed, with the active species being either a fluorine-based ($SF_6$ or $NF_3$) or chlorine ($Cl_2$), along with a diluent such as helium, argon, or another inert gas, or in some cases oxygen. This isotropic plasma etch tends to etch the single crystal silicon at the same rate in all directions. To provide process control, the plasma etch is conventionally carried out under etchant-starved concentrations, with the etch rate controlled by the flow rate of the etchant species.

Alternatively, after the dry breakthrough etch and the dry isotropic etch, a subsequent wet etch can be employed to undercut gate structure 8 along the crystalline structure of the single crystal silicon. As known in the art, crystallographic wet silicon etch chemistry can provide a high degree of selectivity to the crystalline planes.

Figure 1D:
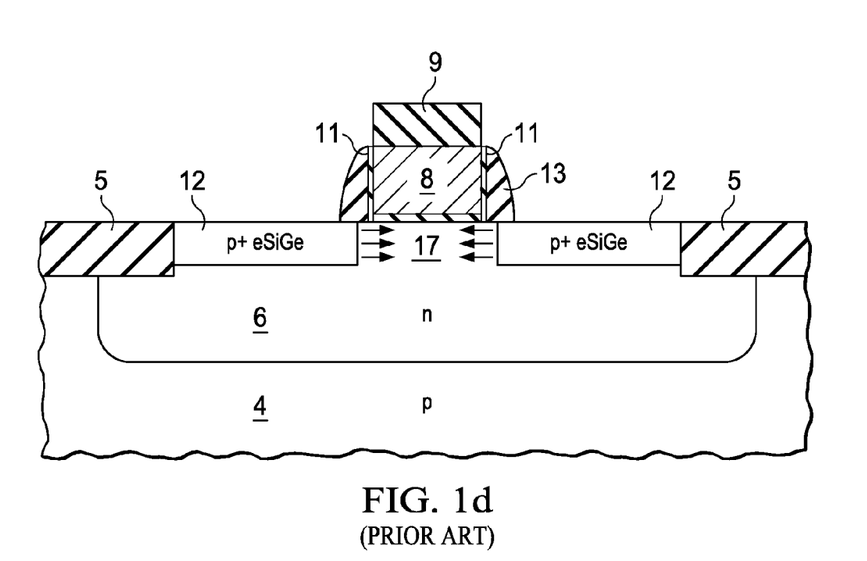

Following the recess etch of FIG. 1c, selective epitaxy of a silicon-germanium alloy is then performed, filling the recesses with embedded SiGe structures 12 as shown in FIG. 1d. Hard mask 9 remains in place over gate electrode 8, to prevent SiGe growth on the top surface of the polysilicon. SiGe structures 12 are typically doped in situ during the epitaxy, and also by subsequent ion implantation, to become heavily doped p-type, forming the source and drain regions of this transistor.

As suggested in FIG. 1d, embedded SiGe structures 12 exert compressive strain on channel region 17 underlying gate electrode 8, because the presence of germanium atoms increases the lattice constant of SiGe structures 12 relative to the surrounding silicon. This compressive strain increases the mobility of holes in channel region 17, enhancing the current drive of this p-channel transistor in an "on" state.

The strain that is exerted by embedded SiGe structures 12 upon channel region 17 depends, in large part, on the position of embedded SiGe structures 12 relative to the edge of gate electrode 8. The strain in channel region 17 increases as the embedded SiGe structures 12 more closely approach the gate edge (i.e., as the "SiGe to gate distance" shortens). And the greater the induced strain in channel region 17, the greater the improvement in carrier mobility in channel region 17. As such, conventional methods for performing the recess etch depicted in FIG. 1c intentionally include some amount of lateral etch under sidewall spacers 13. The extent and shape of lateral etch under sidewall spacers 13 thus define both the channel length of the transistor and the amount of induced strain in channel region 17.

It has been observed, however, that the extent of the lateral etch can be quite non-uniform within an integrated circuit, due to loading effects from neighboring geometries. More specifically, the SiGe-to-gate distance has been observed to vary as much as thirty percent, depending on the pitch (feature width plus spacing) of the source/drain regions being etched (or, indirectly, on the pitch of polysilicon gate electrodes 8 defining the location of the recess edges). This wide variation in lateral etch of the recesses causes widely varying transistor channel lengths and carrier mobility within those integrated circuits in which the gate electrode structures vary in width and spacing.

It has been observed, in connection with this invention, that the variation in undercut is not particularly well-behaved, in that it is difficult to correlate the undercut variation with the local density of source/drain recesses, the proximity of nearby recesses, the widths of specific features, and the like. As such, the ability to compensate for the effects of varying undercut at the design stage (i.e., by oversizing or undersizing the gate widths as patterned, at specific locations) is limited at best.

One could avoid the undesired effects of this undercut variation in several conventional ways. One approach would be to design the gate structures with a relatively constant width and spacing across the integrated circuit; however, this constraint would significantly reduce the ability of the designer to optimize the layout for device and circuit performance. Another approach would be to incorporate sacrificial "dummy" structures, such that the loading effects would be absorbed by non-functional structures. Of course, that approach consumes valuable chip area.

By way of further background, Yeom et al., "Polysilicon Etchback Plasma Process Using HBr, $Cl_2$, and $SF_6$ Gas Mixtures for Deep-Trench Isolation", *J. Electrochemical Soc.*, Vol. 139, No. 2 (1992), pp. 575-79, report increased lateral etching by high HBr gas mixture plasma etches, as applied to polysilicon etchback of polysilicon-filled deep trench isolation structures. The Yeom et al. paper also indicates that HBr and $Cl_2$ gases are known to have low loading effects in plasma etches relative to fluorinated gases such as $SF_6$ or $CF_4$.

BRIEF SUMMARY OF THE INVENTION

Embodiments of this invention provide a method of etching recesses into single-crystal silicon prior to formation of embedded stress-inducing source/drain structures, resulting in uniform transistor performance across the integrated circuit.

Embodiments of this invention provide such an etch having a controllable and constant undercut of gate structures in the resulting recesses.

Embodiments of this invention provide such a method in which the effects of loading on the gate structure undercut are greatly reduced.

Other features and benefits of embodiments of this invention will be apparent to those of ordinary skill in the art having reference to the following specification together with its drawings.

The present invention may be implemented into a plasma etch component of an etch process for etching recesses into single-crystal silicon at eventual source and drain regions of metal-oxide-semiconductor (MOS) transistors. The recess etch may begin with an initial dry etch, to remove initial doped regions of the recesses, followed by a cleanup. Plasma etch of the recesses uses a combination of a fluorine-based or chlorine-based primary etchant species, with hydrogen bromine added at about a 1:1 ratio of flow rate relative to the primary etchant species; inert gas or oxygen is added to the overall gas in the plasma. The combination of the etchant flow rates is kept sufficiently low that the etch reaction is etchant-starved. Following the recess etch, the recesses are epitaxially filled with stress-inducing semiconductor material, such as silicon-germanium and silicon-carbon alloys.

DETAILED DESCRIPTION OF THE INVENTION

The present invention will be described in connection with its preferred embodiment, namely as implemented into a modern complementary metal-oxide-semiconductor (CMOS) fabrication process, as it is believed that this invention is especially beneficial when applied to such an application. However, it is contemplated that this invention can also provide important advantages and benefits when used in connection with other types of integrated circuits and technologies. Accordingly, it is to be understood that the following description is provided by way of example only, and is not intended to limit the true scope of this invention as claimed.

Figure 2:
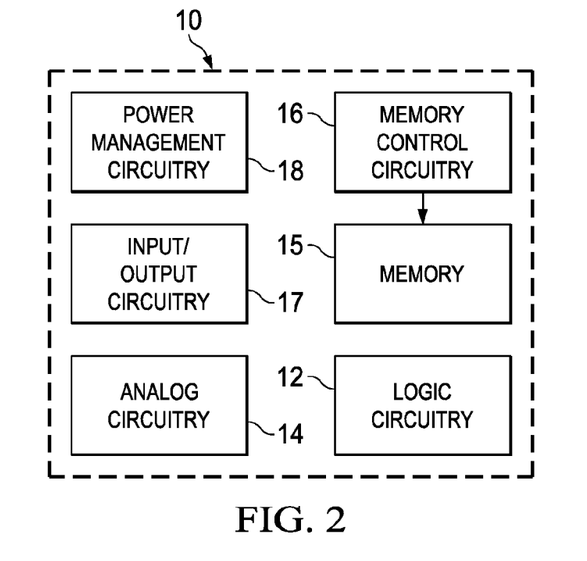
FIG. 2 is a plan view of an integrated circuit, in the form of a System on a Chip (SoC), constructed according to embodiments of this invention.

Many complex modern integrated circuits include circuitry for performing various functions. FIG. 2 illustrates the general layout of integrated circuit 10 which embodies a so-called "system on a chip" (SoC), which includes a wide range of functions to realize an overall system functionality. In this generalized example, logic circuitry 12 includes high performance digital logic functions for performing digital arithmetic and logic functions. Memory 15 provides a memory resource for program and data memory useful to logic circuitry 12. Other peripheral functions also included in SoC integrated circuit 10 as shown in FIG. 2 include analog circuitry 14, memory control circuitry 16, input/output circuitry 17, and power management circuitry 18. Buses and interconnections among these circuit functions are not shown in FIG. 2, but of course are provided by way of one or more metal interconnection levels in integrated circuit 10, as typical in the art.

As evident from this arrangement of FIG. 2, the various circuit functions are disposed at various locations within the layout of integrated circuit 10. And as known in the art, the density of transistor features generally varies among these functions. For example, logic circuitry 12 and memory 15 may be constructed with maximum density of minimum feature size transistors, to minimize chip area, because these functions will tend to dominate the overall chip area of integrated circuit 10. Conversely, the peripheral functions of analog circuitry 14, memory control circuitry 16, input/output circuitry 17, and power management circuitry 18 are less conducive to realization by repetitive transistor layout, and are more optimally constructed by function-specific circuits, and as such will tend to have a lower device density than logic circuitry 12 and memory 15. As such, the width and spacing (i.e., pitch) of transistor features will vary among the various functions within integrated circuit 10, thus differing at the various locations of the surface of integrated circuit 10. In addition, the edges of the functions (e.g., at the edges of logic circuitry 12 and memory 15) will necessarily have a lower localized feature density than the central locations of those functions.

However, it is of course desirable to optimize transistor performance across the various functions of integrated circuit 10, including through the use of embedded silicon alloy source/drain regions to exert tensile or compressive stress on the transistor channel regions. Carrier mobility, and thus current drive, is improved in p-channel metal-oxide-semiconductor (MOS) transistors by the exertion of compressive strain in the channel region. The embedding of silicon-germanium (SiGe) alloy as source-drain regions imparts that compressive strain, because the germanium atoms increase the lattice constant of SiGe relative to single-crystal silicon. Conversely, re-channel MOS transistors exhibit improved mobility under tensile strain; source/drain regions constructed of a lower lattice constant alloy such as silicon-carbon is known to exert tensile stress on the channel region. To take advantage of this performance improvement, modern integrated circuit 10 is constructed according to embodiments of this invention with either or both of its p-channel and n-channel MOS transistors having embedded silicon alloy source and drain regions, in various ones of its circuit functions as shown in FIG. 2.

Figure 3A:
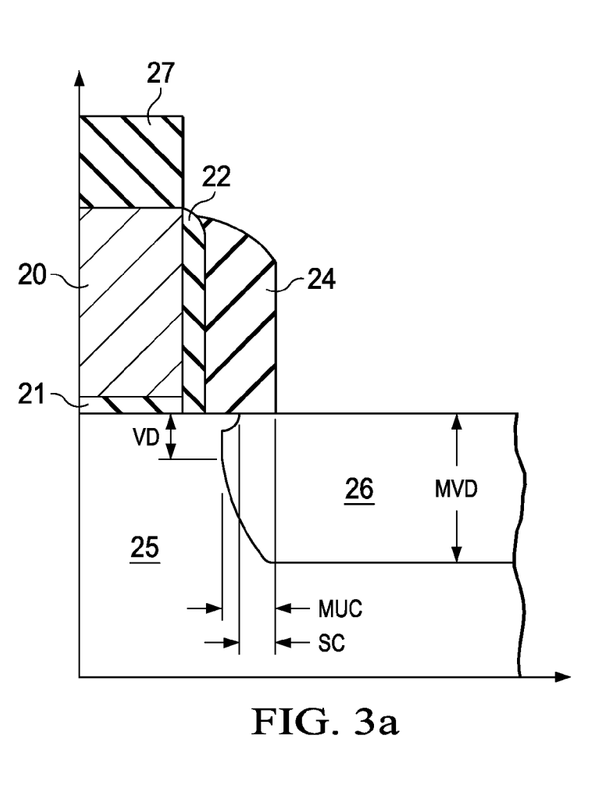
FIGS. 3a and 3b are cross-sectional views of MOS transistors illustrating examples of desired shapes of etched source/drain recesses for transistors of different feature sizes.
Figure 3B:
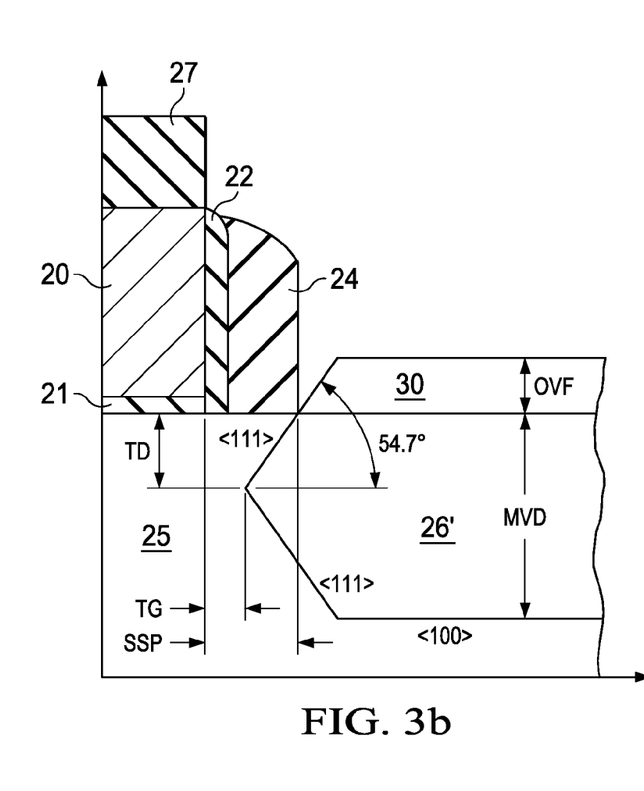

As discussed above in the Background of the Invention, the embedded silicon alloy source/drain regions are formed by first etching a recess into the active regions in a self-aligned manner relative to the gate structure, followed by epitaxial growth of the silicon alloy crystal from the surface of the recess. The strain imparted to the channel region by the embedded silicon alloy source/drain regions, and thus the performance impact of the alloy, depends in large part on the shape and location of the recess relative to the gate electrode itself. Referring now to FIGS. 3a and 3b, an explanation of the various dimensions of the etched recesses that are involved in determining this impact will now be described in detail.

FIG. 3a illustrates, in cross-section, an example of the result of such a recess etch prior to embedded SiGe (or other silicon alloy) formation, according to a process flow for sub-micron gate widths. In this case, polysilicon gate electrode 20 overlies gate dielectric 21, which in turn overlies single crystal silicon active region 25, and is shown in cross-section taken across its width (i.e., perpendicular to source/drain current flow in the eventual transistor). Thin silicon dioxide layer 22 is disposed on the sides of gate electrode 20, formed by thermal "re-oxidation" of the polysilicon of gate electrode 20 after its patterned etch. In this transistor construction, as is typical in modern sub-micron process flows, sidewall spacer 24 is formed on the sidewalls of the gate structure by deposition of a dielectric layer (e.g., silicon dioxide, silicon nitride) overall, followed by an anisotropic etch.

FIG. 3a illustrates a typical shape of one end of recess 26 etched into active region 25, after the formation of the gate structure including gate electrode 20, silicon dioxide layer 22, and sidewall spacer 24. Several dimensions are of interest, as factors in the amount of strain induced by the eventual silicon alloy formed into recess 26. By way of example, the maximum vertical depth MVD of recess 26 into active region 25 from its surface may be on the order of 1 micron. The maximum undercut dimension MUC indicates the extent of the undercut under the edge of sidewall spacer 24; in one example, the maximum undercut MUC ranges from about 20% to 35% of the maximum vertical depth MVD.

As shown in FIG. 3a in this example, no sharp corners are present in the profile of recess 26 underlying the gate structure. Rather, the side of recess 26 curves away from the gate structure from the point of its maximum undercut; the depth of the point at which recess 26 curves away from the channel region is also an important dimension in determining the channel region strain, and is indicated in FIG. 3a as vertical depth VD. An example of vertical depth VD is about 10% of the maximum vertical depth MVD. Also in this case, the portion of active region 25 immediately underlying the gate structure does not laterally etch to the extent of maximum undercut MUC. Typically, this surface region has been previously implanted with dopant to define the transistor threshold voltage; this implanted region may have a lower etch rate (for plasma etches) than do unimplanted regions. The dimension shown in FIG. 3a as surface cut SC indicates the undercut of active region 25 at its interface with the gate structure. For example, surface cut SC can vary from about 20% to 35%, ranging from about one-half of maximum undercut MUC to the full maximum undercut MUC dimension (in which case no difference in etch rate at the surface was exhibited).

Each of these dimensions MVD, MUC, VD, and SC have been observed to be factors in the amount of strain induced in the transistor channel region by subsequently formed silicon alloy within recess 26. These dimensions define the distance of the silicon alloy to the edge of gate electrode 20 (e.g., the "SiGe-to-gate distance"), and also the extent to which strain is induced from the volume of silicon alloy that is formed.

FIG. 3b illustrates another example of the result of a recess etch, in this case in which a wet recess etch is performed subsequently to the plasma recess etch, to further define the undercut. This cross-sectional view represents the shape of recess 26' in integrated circuits with deep submicron feature sizes, for example in the case of feature sizes well below 0.5 micron. As in FIG. 3a, the gate structure includes gate electrode 20, silicon dioxide layer 22, and sidewall spacer 24, formed in the manner described above, but in this case at smaller dimensions.

In the example shown in FIG. 3b, recess 26' has a "sigma" or "diamond" profile resulting from the tendency of the wet silicon etch to follow the single-crystal silicon lattice of active region 25. In this case, the maximum vertical depth MVD of recess 26' is on the order of 1 micron from the original surface of active region 25. The undercut portion of recess 26' extends under the gate structure according to the lattice angle, which for silicon is 54.7°. The tip depth TD of recess 26' corresponds to the depth below the surface of active region 25 of the tip of the undercut. Tip-to-gate distance TG is the distance from this tip to the edge of gate electrode 20, while the SiGe-to-gate distance SSP is the distance of silicon alloy to the edge of gate electrode 20 at the surface of active region (and in this case, is largely determined by the combined thickness of silicon dioxide layer 21 and sidewall spacer 22). Overfill OVF is the thickness by which the eventual epitaxial silicon alloy extends above the original surface of active region 25, and of course depends on the tip depth TD and distance of the tip from the edge of sidewall spacer 22. It has been observed, in connection with this invention, that these dimensions are important in the extent to which strain is induced in the transistor channel region, for transistors of this deep submicron size and with recess etches having this "sigma" or "diamond" profile.

As mentioned above, the effect of embedded silicon alloy source/drain regions on transistor channel regions and thus transistor performance has been observed, in connection with this invention, to be quite sensitive to the shapes and associated dimensions of recess undercut described above. Unfortunately, as discussed above in the Background of the Invention, the extent of undercut resulting from plasma recess etch processes has been observed, in connection with this invention, to strongly vary with the density and pitch of the recesses being etched (stated another way, with the density and pitch of transistor gate structures). And as discussed above relative to FIG. 2, the various circuit functions disposed at various locations within the layout of integrated circuit 10 are optimally constructed with transistor features that vary from function to function, and that therefore vary over the overall chip area of integrated circuit 10. As also mentioned above, the local effective feature pitch will be lower at the edges of certain functions such as logic circuitry 12 and memory 15 than interiorly to those functions. As a result, the pitch of the recesses to be etched for embedded silicon alloy formation will vary within integrated circuit 10, thus causing variations in transistor performance from circuit to circuit and in some cases within circuit functions. The benefit of single-chip integration in providing matching device parameters will be diluted due to this loading effect on the recess undercut, causing performance degradation or requiring additional design margin to accommodate the transistor variation.

A manufacturing process including a silicon recess etch that greatly reduces the loading effects (i.e., variation with feature pitch) on undercut, in a CMOS process according to embodiments of this invention, will now be described in detail with reference to FIGS. 4a through 4h.

Figure 4A:
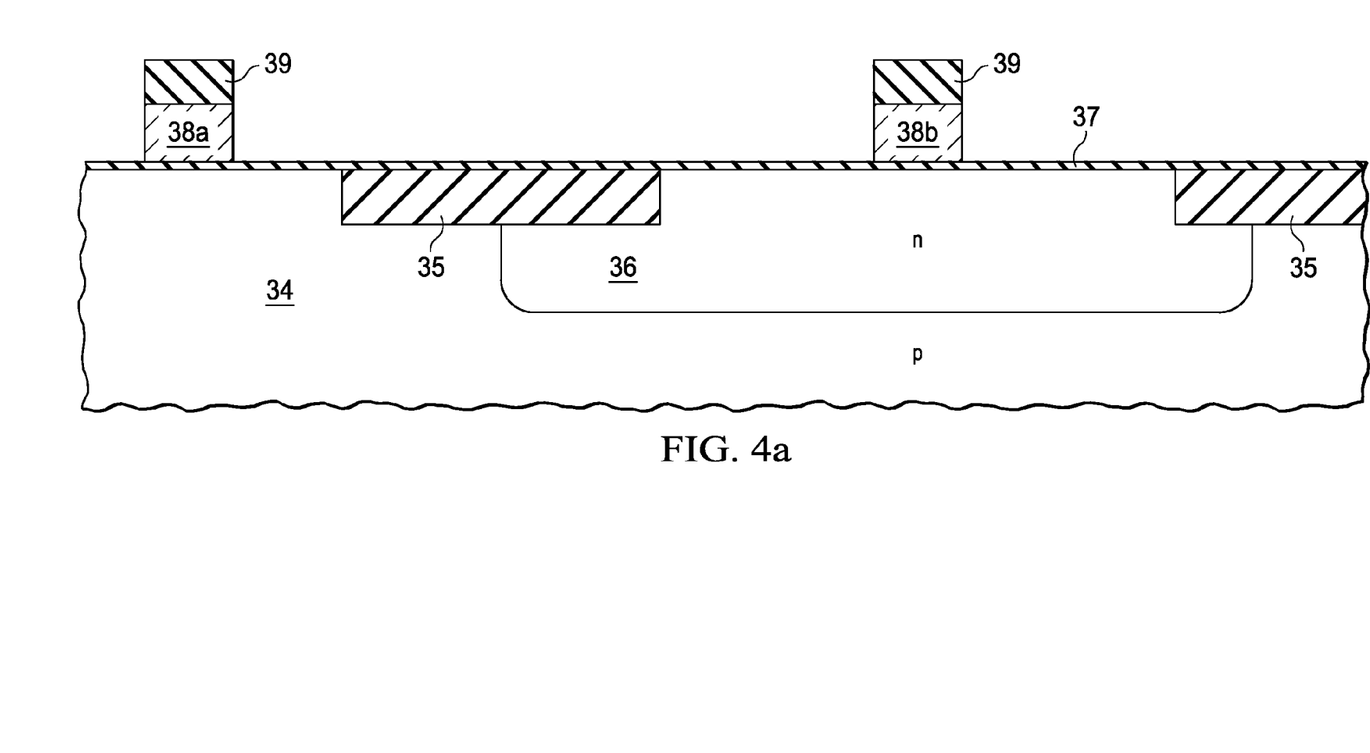
FIGS. 4a through 4h are cross-sectional views of an integrated circuit at various stages of construction according to embodiments of this invention.

FIG. 4a illustrates a cross-section of integrated circuit 10 at a relatively early point in its manufacture. In this example, a single-well CMOS process is used to fabricate integrated circuit 10 at a surface of p-type silicon substrate 34. Substrate 34 may be formed of bulk single-crystal silicon of the desired crystal orientation, or alternatively may be a single-crystal silicon layer disposed over an insulating layer at a surface of a "handle wafer", in a silicon-on-insulator (SOI) realization. N-well 36 is formed at selected locations of the surface of substrate 34 by a conventional masked implant, and will be the locations of p-channel MOS transistors. Alternatively, a twin-well process may be used, in which case a p-well will also be formed at the surface of substrate 34, into which n-channel transistors will be formed. Shallow trench isolation structures 35 have been formed at the surface of substrate 34 (and well 36) in the conventional manner by way of recess etch, oxide deposition, and planarization or etchback. Of course, isolation structures 35 may alternatively be formed by other techniques. Active regions at the surface are defined at the surface as those locations other than the locations of isolation structures 35.

As mentioned above, at the point in the manufacture of integrated circuit 10 shown in FIG. 4a, gate dielectric layer 37 has been formed overall, by thermal oxidation of the surface of the active regions or by deposition, or both, depending on the material of gate dielectric layer 37. Polysilicon gate electrodes 38a, 38b are defined for n-channel and p-channel transistors, respectively, with gate electrode 38a for the re-channel transistor disposed at a location of substrate 34 overlying gate dielectric 37, and gate electrode 38b for the p-channel transistor at the desired location over n-well 36. Gate electrodes 38a, 38b are formed in the conventional manner, by deposition of a polysilicon layer overall, and photolithographic pattern and etch processes. In this embodiment of the invention, mask layer 39 is a "hard" mask layer, for example formed of silicon nitride, and remains in place over gate electrodes 38a, 38b at the point in the process shown in FIG. 4a.

Figure 4B:
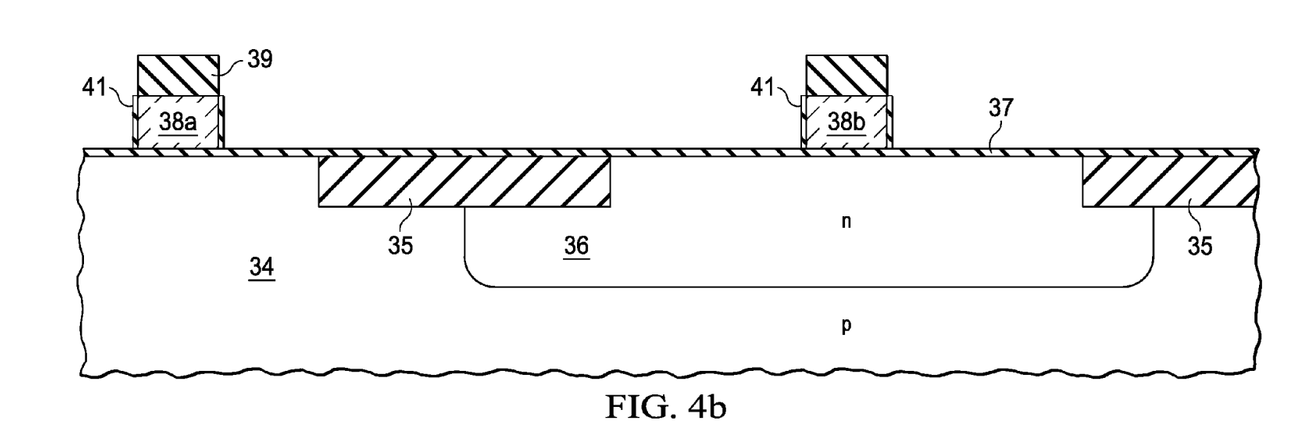
Figure 4C:
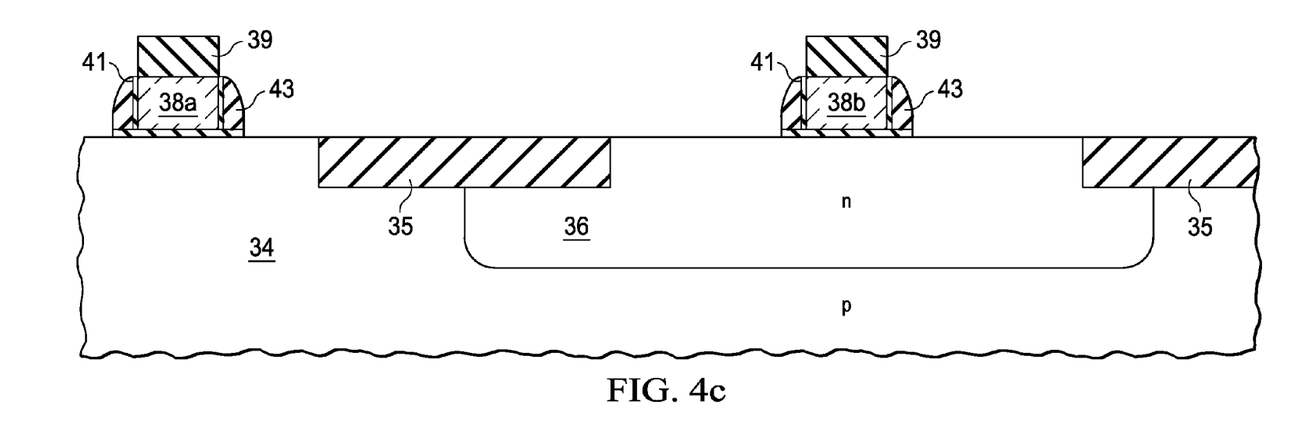

Following the definition of gate electrodes 38a, 38b, a "re-oxidation" process is performed, resulting in thermal silicon dioxide 41 formed on the sidewalls of polysilicon gate electrodes 38a, 38b, as shown in FIG. 4b. The thickness of re-ox silicon dioxide 41 is contemplated to be on the order of 10 to 20 Å, in modern sub-micron processes such as that according to this embodiment of the invention. Following this re-oxidation process, sidewall spacers 43 are formed on the re-oxidized sidewalls of gate electrodes 38a, 38b as shown in FIG. 4c, by way of deposition of the spacer material followed by an anisotropic etch. The material of sidewall spacers 43 may be silicon dioxide, silicon nitride, or another dielectric material or stack of dielectric materials. Ion implantation of the active regions may be performed prior to formation of sidewall spacers 43 for either or both of the p-channel and n-channel transistors, if desired for the particular source/drain dopant profile.

Figure 4D:
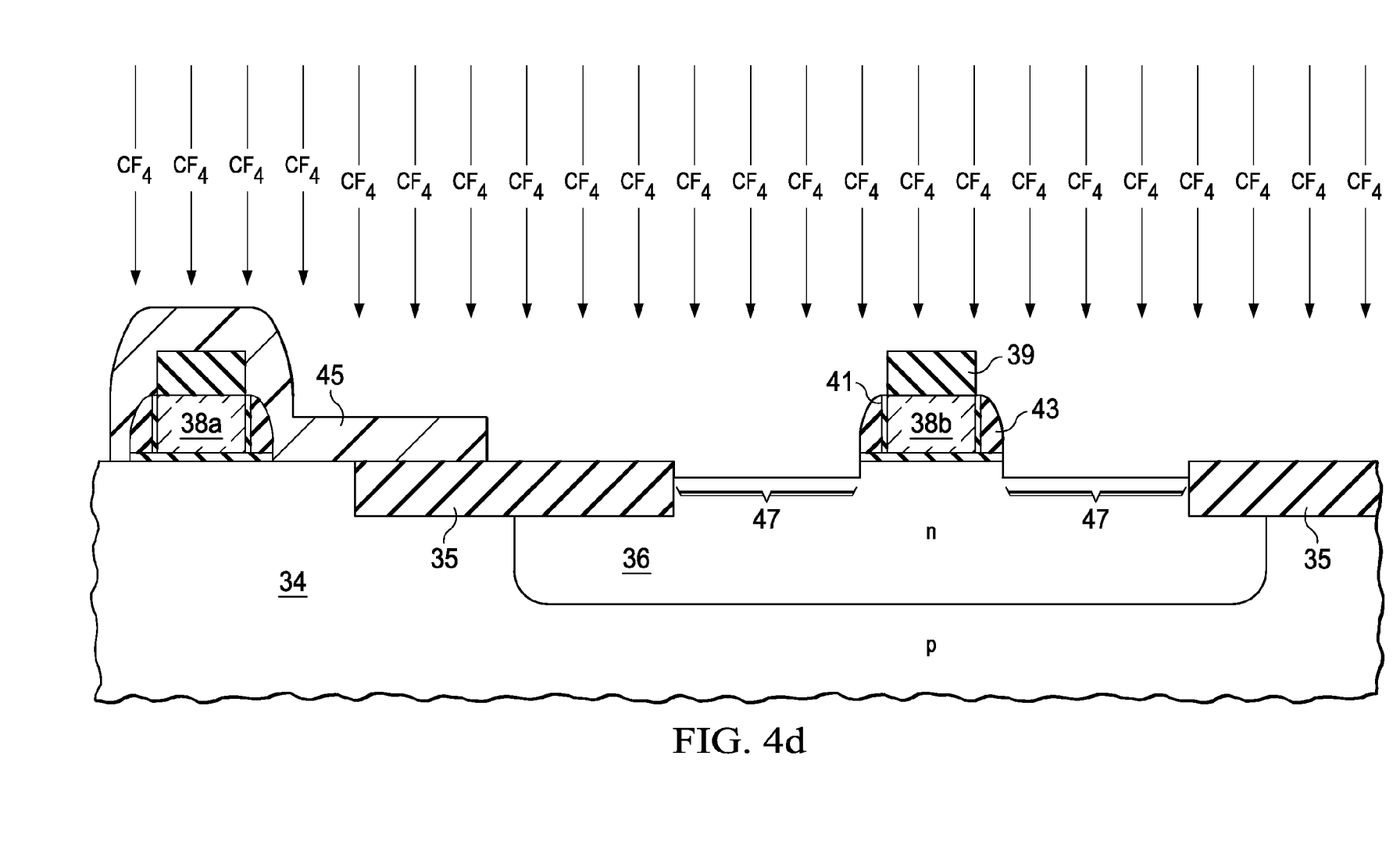

As shown in FIG. 4d, regions of the surface are next protected from silicon recess etch by masking layer 45. Masking layer 45 consists of deposited silicon nitride, or another hard mask material, according to this embodiment of the invention, of the necessary thickness to withstand the etch conditions of the recess etch to be described below. Conventional photolithography and nitride (or other appropriate) etch is then performed to remove masking layer 45 from those regions at which recesses for eventual silicon-alloy formation are to be etched. In this embodiment of the invention, p-channel MOS transistors are to be formed with silicon-germanium source/drain regions, while re-channel MOS transistors in integrated circuit 10 will have source/drain regions in the bulk silicon of substrate 34. As such, as shown in FIG. 4d, masking layer 45 protects the locations of the active region on either side of gate electrode 38a, at the location of an eventual n-channel MOS transistor. Source/drain recesses are then etched, beginning with a breakthrough anisotropic etch as also shown in FIG. 4d.

According to this embodiment of the invention, the breakthrough etch is a brief plasma etch of the silicon active regions exposed by masking layer 45, using a conventional silicon etch plasma, for example as a timed etch using a $CF_4$-based chemistry (e.g., a source gas including $CF_x$, $CH_xF_x$, and Ar), under anisotropic conditions. This anisotropic etch operates to remove any native oxide at the surface of n-well 36. This "breakthrough" plasma etch results in shallow recesses 47 at the eventual source and drain regions on either side of gate electrode 38b, as shown in FIG. 4d in this example.

Figure 4E:
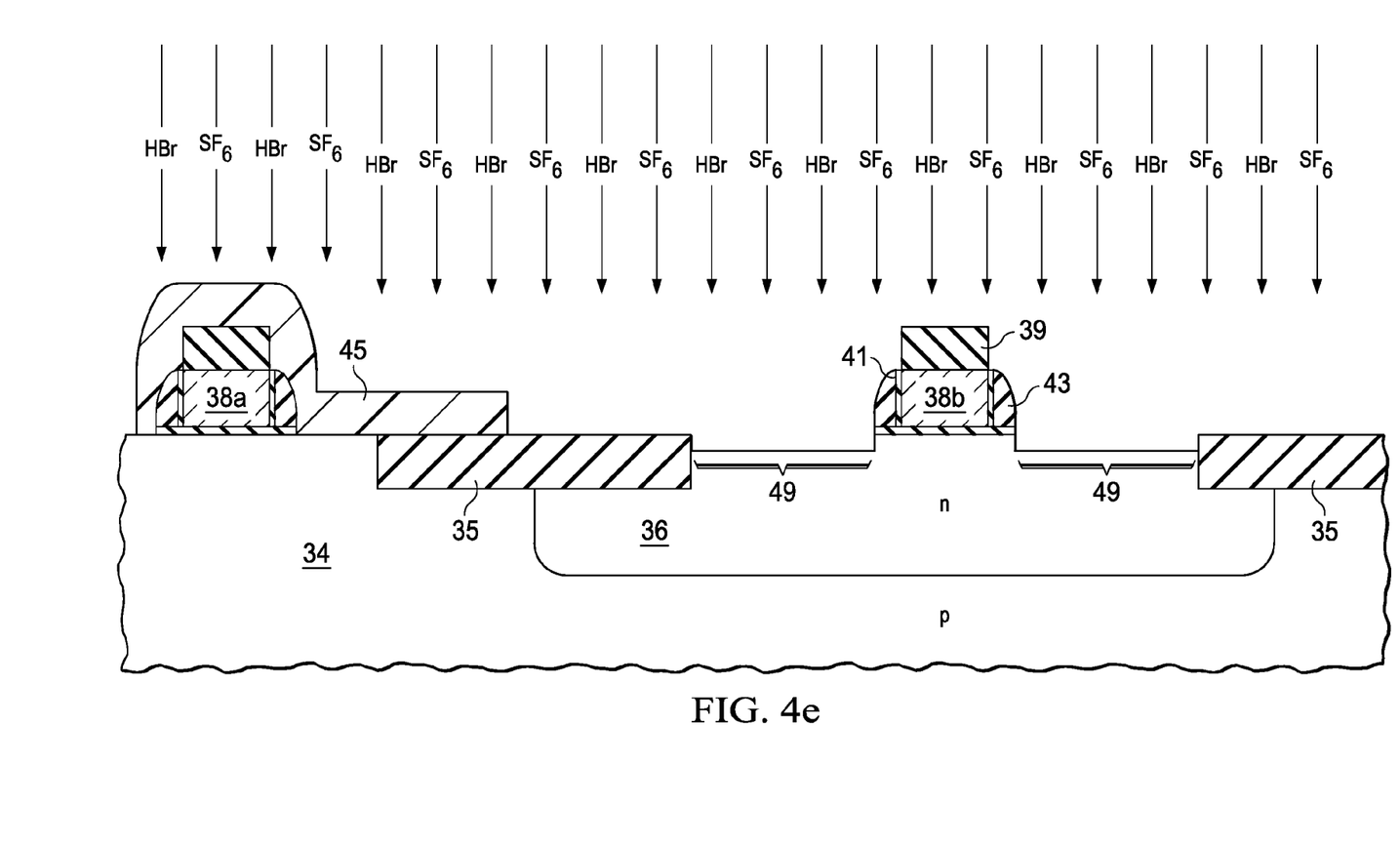

According to embodiments of this invention, as shown in FIG. 4e, the recess etch continues with a plasma etch of the exposed silicon. According to this embodiment of the invention, this plasma etch is performed under isotropic conditions, using a source gas that includes a primary silicon etchant in combination with an inert or non-reactive diluents gas, and with an additive of hydrogen bromide (HBr). It is contemplated that this plasma etch is carried out in a conventional plasma etch reactor, with relatively low flow rates of the primary silicon etchant and the HBR additive, to facilitate control of the recess etch rate since a natural endpoint is not available in the active regions being etched (e.g., n-well 36). In other words, the reactive species in this plasma recess etch are provided at "etchant-starved" concentrations, so that the etch rate is strongly dependent on the concentration of the etchant species. According to embodiments of this invention, the primary silicon etchant species is one or more conventional silicon etchants, such as sulfur hexafluoride ($SF_6$), nitrogen trifluoride ($NF_3$), and elemental chlorine gas ($Cl_2$). The additive of hydrogen bromide (HBr) in embodiments of this invention is provided at about a 1:1 flow rate ratio with that of the primary silicon etchant, although some variation from that ratio is permitted. For example, the flow rate of the primary silicon etchant ($SF_6$, $NF_3$, $Cl_2$) may range from about 2 to about 4 sccm, in combination with a flow rate of hydrogen bromide (HBr) ranging from about 2 to about 5 sccm; the source gas for the etch also includes a diluent such as an inert gas (e.g., helium, argon) or oxygen ($O_2$), at a flow rate ranging from about 60 to about 100 sccm. An example of the reactor conditions for this plasma recess etch, according to embodiments of this invention, includes a low pressure in the chamber (e.g., between about 2 to about 5 mTorr), at an elevated temperature ranging from about 60 to about 80 degrees Celsius. The power of the RF excitation is contemplated to range from about 200 to about 400 W.

As shown in FIG. 4e, this plasma recess etch including both a primary silicon etchant and an HBr additive controllably etches recesses 49 into the exposed silicon active regions at source and drain locations of the eventual p-channel MOS transistors, in this example. Edges of the gate structure including polysilicon gate electrode 38b, its re-oxidation silicon dioxide 41, and its sidewall spacers 43 are undercut by this etch, with the undercut having a rounded isotropic profile as shown. As described above, it is this undercut that enhances the strain effect of subsequently deposited silicon alloy material on the channel region portion of n-well 36 underlying gate electrode 38b. A conventional post-dry-etch cleanup is then performed to remove etch residue and other contaminants from the surface.

Figure 5:
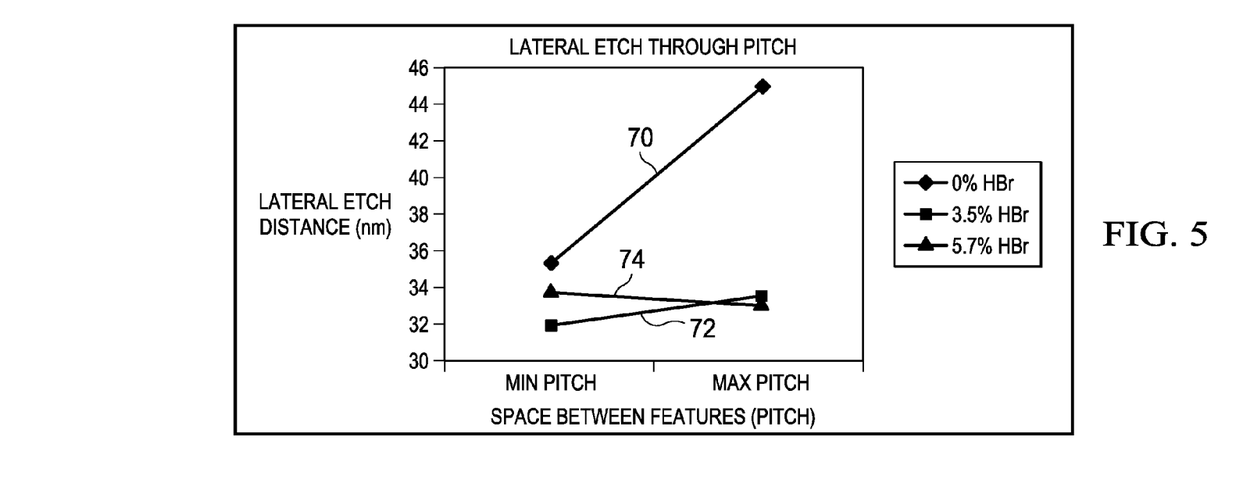
FIG. 5 is a plot illustrating lateral etch variation over feature pitch in a conventionally-fabricated integrated circuit and according to embodiments of this invention.

It has been observed that the plasma recess etch process according to this embodiment of the invention provides improved control of the lateral etch (i.e., undercut) of gate structures, with a much lower loading effect than that observed for conventional plasma recess etch using the primary silicon etchant but without the HBR additive. FIG. 5 qualitatively illustrates the observed loading effect under different concentrations of HBr in the plasma recess etch of silicon. Curve 70 illustrates the loading effect of the conventional plasma recess etch, in which no HBr additive was included in the etch chemistry. As indicated by that curve 70, the lateral etch distance increases dramatically at the maximum pitch (width plus spacing) of the recesses being etched (equivalently, the pitch of polysilicon gate electrodes 38), with the variation in lateral etch distance amounting to as much as 30% of the submicron feature size (10 nm).

Curves 72 and 74 illustrate the observed lateral etch ranges for minimum and maximum pitch for 3.5% HBr and 5.7% HBr concentrations by volume in the plasma etch chemistry (i.e., the percentage of HBr flow relative to the total gas flow). In each of these cases, the lateral etch variation is much smaller than that exhibited in the absence of HBr, namely on the order of 10% of the variation exhibited by the conventional etch. The higher HBr concentration shown by curve 74 in fact indicates a negative loading effect, with less undercut for maximum pitch features than for minimum pitch features.

It is contemplated that the addition of the HBr additive into the plasma recess etch chemistry achieves this minimum loading effect due to several cooperative reasons. First, hydrogen bromide is believed to laterally etch silicon more readily than do the primary fluorine-based and chlorine-based silicon etchant species; it is further believed that inert diluents such as argon activate the HBr to facilitate the lateral etch rate.

In addition, it is believed that the product of the etch reaction between silicon and the HBr additive causes the active HBr species to linger at the location of the recesses, more so than in the case of fluorine-based and chlorine-based etchant. As mentioned above, the plasma recess etch performed at "etchant-starved" concentrations of the reactive species, to allow reasonable control of the etch rate. This causes the etch rate to be strongly dependent on the concentration of the etchant species, and indeed on the localized concentration of the etchant at the exposed silicon. The lingering effect of the HBr species is believed to reduce the extent to which local HBr concentrations vary across the wafer surface as the etch progresses, which in turn maintains these local HBr concentrations relatively uniform regardless of the density or pitch of the recesses being etched. In contrast, it is believed that the volatility of the primary fluorine-based and chlorine-based etchant species at the etching site rapidly reduces the local etchant concentration at dense, minimum pitch, regions of the surface. In conventional recess etch processes that rely on the primary etchant species for lateral etch, consumption of the etchant species at the etch location locally depresses the etchant concentration at these minimum pitch (e.g., highest recess density) locations, reducing the lateral etch rate. In order to obtain the desired undercut at the minimum pitch structures using the conventional etch chemistry, the maximum pitch structures are laterally over-etched, as shown in FIG. 5.

Figure 4F:
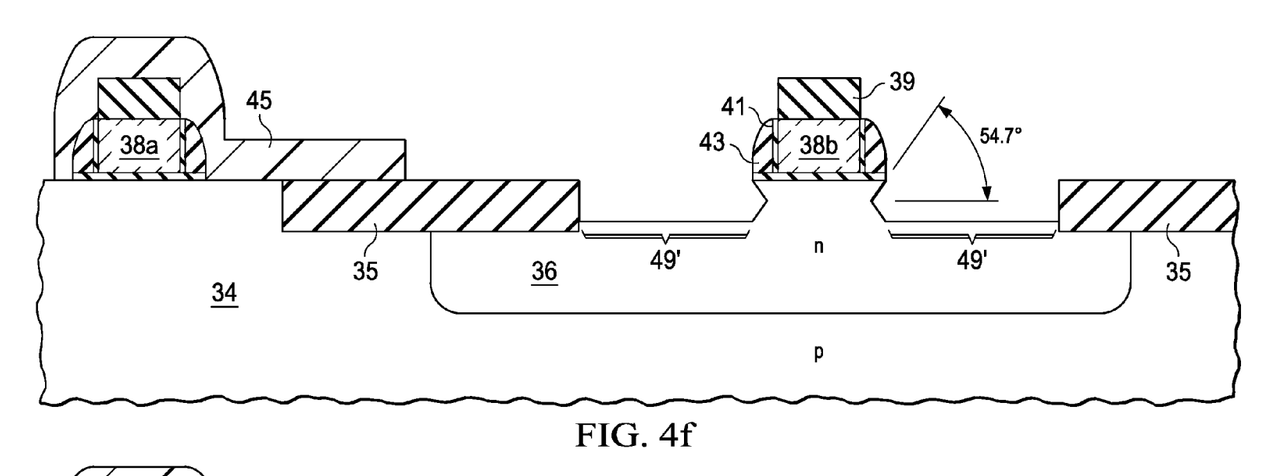

If additional undercut (i.e., shorter tip-to-gate spacing) is desired, a highly selective wet etch of the exposed silicon can optionally be performed after the isotropic plasma etch and cleanup described above. An example of this wet etch is performed under conventional crystallographic etch conditions to control of the amount of undercut and also the shape of the profile, which in this case follows the crystal lattice angle (e.g., an angle of 54.7° between the <111> and <100> crystal planes in silicon), as discussed above relative to FIG. 3b. An example of the chemistry for this optional wet etch is a solution of HNA (a mixture of hydrofluoric acid, nitric acid, and acetic acid). An example of the result of this optional additional wet etch is illustrated in FIG. 4f, in which angled recesses 49' extend under sidewall structures 43 at gate electrode 38b. It has been observed, however, that this optional wet etch does not provide additional correction to any loading effects (i.e., if used in conventional recess etch processes), beyond that of the plasma recess etch according to embodiments of this invention.

Figure 4G:
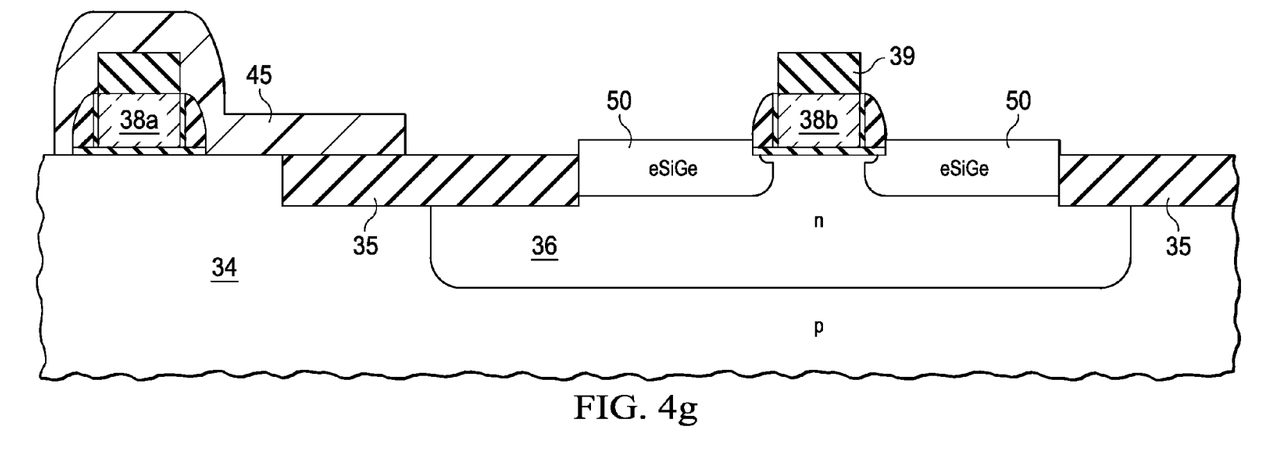
Figure 4H:
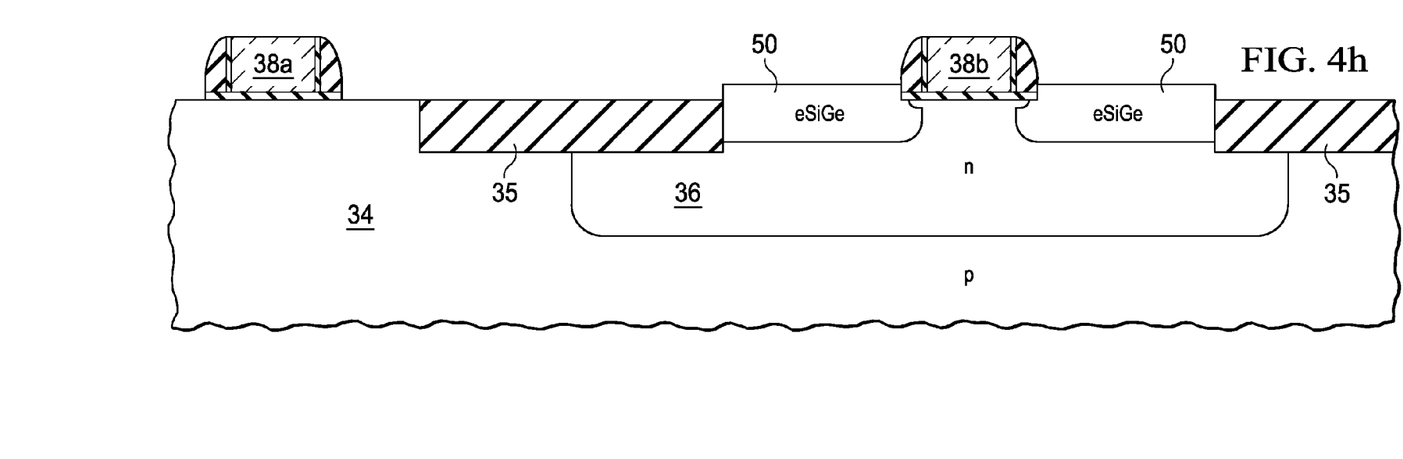

Referring now to FIG. 4g, after completion of the recess etch according to embodiments of this invention, the desired silicon alloy is epitaxially formed within recesses 49. An example of the result of this epitaxy is shown in FIG. 4g by embedded silicon-germanium (eSiGe) source/drain regions 50 for the eventual p-channel MOS transistors, formed into recesses 49 (i.e., etched without the optional wet etch of FIG. 4f) into surface locations of n-well 36. As known in the art, eSiGe regions 50 may be doped in situ during epitaxial formation, if desired. Following eSiGe epitaxy, the fabrication of integrated circuit 10 continues in the conventional manner, with the removal of mask layer 45 over the n-channel transistor locations, and the removal of hard mask layer 39 overlying gate electrodes 38, as shown in FIG. 4h. Additional processes including source/drain doping of both the p-channel and the n-channel transistor source/drain regions, and formation of the desired metal conductors and contacts through insulator to the transistors and other circuit elements are also performed, to complete integrated circuit 10.

As evident from this description, this example of the recess etch prior to silicon alloy formation was directed only to the p-channel transistors (i.e., recess etch was performed only into n-well 36). Alternatively or in addition, a similar silicon recess etch may be performed into the p-type active regions at which n-channel transistors are formed. In the n-channel case, the silicon alloy formed into the recesses will be selected to exert tensile strain on the channel region underlying gate electrodes 38a; an example of such a tensile silicon alloy includes silicon-carbon. If recesses are to be etched for both n-channel and p-channel transistors, the recess etch may be performed simultaneously for both regions; alternatively, recess etch and silicon alloy formation may be performed sequentially for the two transistor channel conductivity types, depending on the desired process integration.

Embodiments of this invention provide important advantages in the fabrication and design of sub-micron integrated circuits utilizing strain engineering techniques. The recess etch according to embodiments of this invention enables embedded silicon alloy structures to be placed closer to the active channel region of the corresponding MOS transistors, enhancing the desirable effects of strain on carrier mobility in the transistor channel regions and thus improving transistor performance and drive. According to embodiments of this invention, the lateral etch or undercut is much less sensitive to the local density and pitch of the recess structures being etched, resulting in precise control of the undercut profile and depth of these recesses. Because the shape and dimensions of the undercut can be more closely controlled according to embodiments of this invention, variation in transistor performance due to loading effects is greatly reduced. This allows the circuit designer to optimally layout active devices during the design stage of the integrated circuit, without requiring dummy structures to absorb recess etch loading effects. Improved device performance with optimized chip area utilization is thus accomplished as a result of embodiments of this invention.

While the present invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an integrated circuit at a silicon surface of a substrate, comprising the steps of:
    forming isolation dielectric structures at selected locations of the surface, the isolation dielectric structures defining active regions of the silicon surface therebetween;
    forming gate electrode structures overlying selected locations of active regions of the silicon surface;
    etching recesses into a plurality of the active regions at locations adjacent to the gate electrode structures, and undercutting edges of the adjacent gate electrode structures, by a sequence of steps comprising:
        providing a source gas comprised of the mixture of a primary reactant species, the primary reactant species selected from the group consisting of fluorine-based reactants and chlorine-based reactants, with a diluent gas and with hydrogen bromine gas, the hydrogen bromine gas having a flow rate about the same as a flow rate of the primary reactant species; and
        exciting the source gas with RF energy to create a plasma; and
        exposing the silicon surface to the excited source gas; and
    then epitaxially forming a silicon alloy in the recesses.

2. The method of claim 1, wherein the step of forming the gate electrode structures comprises:
    forming gate electrodes at selected locations of the active regions; and
    then forming dielectric spacers on sides of the gate electrodes;
    wherein the etching step etches recesses that undercut edges of the dielectric spacers.

3. The method of claim 1, wherein the flow rate of the primary reactant species in the source gas is constrained so that reaction of silicon at the silicon surface with the primary reactant species is limited by the concentration of the primary reactant species at the silicon surface.

4. The method of claim 1, wherein the flow rate of the primary reactant species ranges from about 2 to 4 sccm;
    and wherein the flow rate of hydrogen bromide ranges from about 2 to 5 sccm.

5. The method of claim 4, wherein the flow rate of diluent gas ranges from about 60 to 100 sccm.

6. The method of claim 1, wherein the primary reactant species is selected from the group consisting of sulfur hexafluoride ($SF_6$), nitrogen trifluoride ($NF_3$), and chlorine gas ($Cl_2$).

7. The method of claim 1, wherein the diluent gas is selected from the group consisting of oxygen, argon, and helium.

8. The method of claim 1, wherein the exciting and exposing steps are performed at a pressure ranging from about 2 to 5 mTorr, at a temperature ranging from about 60° C. to 80° C.;
    and wherein the power of the RF energy in the exciting step ranges from about 200 to 400 W.

9. The method of claim 1, wherein the step of etching recesses further comprises:
    before the providing, exciting, and exposing steps, plasma etching the silicon surface under anisotropic conditions for a selected time.

10. The method of claim 1, wherein the step of forming gate electrode structures defines a plurality of source/drain locations in the active regions at varying width and spacing over the silicon surface, and at which the recesses are etched in the etching step.

11. The method of claim 1, wherein the silicon alloy is selected from the group consisting of silicon-germanium and silicon-carbon.

12. The method of claim 1, wherein the step of etching recesses further comprises:
    after the exposing step, exposing the silicon surface to a crystallographic wet etch.

13. A method of fabricating an integrated circuit at a silicon surface of a substrate, comprising the steps of:

forming isolation dielectric structures at selected locations of the surface, the isolation dielectric structures defining active regions of the silicon surface therebetween;

forming gate electrode structures overlying selected locations of active regions of the silicon surface;

etching recesses into a plurality of the active regions at locations adjacent to the gate electrode structures by a sequence of steps comprising:

providing a source gas comprised of the mixture of a primary reactant species, the primary reactant species selected from the group consisting of fluorine-based reactants and chlorine-based reactants, with a diluent gas and with hydrogen bromine gas, the hydrogen bromine gas having a low flow rate about the same as a low flow rate of the primary reactant species so that an etchant reaction is etchant-starved;

exciting the source gas with RF energy to create a plasma; and exposing the silicon surface to the excited source gas; and then epitaxially forming a silicon alloy in the recesses.

14. The method of claim 13, wherein the low flow rate of the primary reactant species ranges from about 2 to 4 sccm, the low flow rate of hydrogen bromide ranges from about 2 to 5 sccm, and the flow rate of diluent gas ranges from about 60 to 100 sccm in order to achieve the etchant-starved etchant reaction.

15. The method of claim 14, wherein the step of forming the gate electrode structures comprises:

forming gate electrodes at selected locations of the active regions; and then forming dielectric spacers on sides of the gate electrodes;

wherein the etching step etches recesses that undercut edges of the dielectric spacers.

16. The method of claim 15, further comprising the steps of:

performing a break-through anisotropic plasma etch prior to providing the source gas; and performing a crystallographic wet etch of the silicon surface after the exposing step.

17. A method of fabricating an integrated circuit at a silicon surface of a substrate, comprising the steps of:

forming isolation dielectric structures at selected locations of the surface, the isolation dielectric structures defining active regions of the silicon surface therebetween;

forming gate electrode structures overlying selected locations of active regions of the silicon surface;

etching recesses into a plurality of the active regions at locations adjacent to the gate electrode structures by a sequence of steps comprising:

performing a break-through anisotropic plasma etch;

performing an isotropic plasma etch by:

providing a source gas comprised of the mixture of a primary reactant species, the primary reactant species selected from the group consisting of fluorine-based reactants and chlorine-based reactants, with a diluent gas and with hydrogen bromine gas, the hydrogen bromine gas having a low flow rate about the same as a low flow rate of the primary reactant species so that an etchant reaction is etchant-starved;

exciting the source gas with RF energy to create a plasma; and exposing the silicon surface to the excited source gas; and after the isotropic plasma etch, performing a crystallographic wet etch of the silicon surface; and then epitaxially forming a silicon alloy in the recesses.

\* \* \* \* \*